(12) United States Patent
Liu et al.

(10) Patent No.: US 12,557,384 B2
(45) Date of Patent: Feb. 17, 2026

(54) DISPLAY MODULE, DISPLAY APPARATUS AND PLANARIZATION PROCESS

(71) Applicants: Chengdu BOE Optoelectronics Technology Co., Ltd., Sichuan (CN); BOE Technology Group Co., Ltd., Beijing (CN)

(72) Inventors: Li Liu, Beijing (CN); Quan Liu, Beijing (CN); Xing Xiong, Beijing (CN); Chunlei Xu, Beijing (CN); Qinglin Wen, Beijing (CN); Zhong Yang, Beijing (CN); Yunlong Ji, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 18/023,103

(22) PCT Filed: May 31, 2022

(86) PCT No.: PCT/CN2022/096385
§ 371 (c)(1),
(2) Date: Feb. 24, 2023

(87) PCT Pub. No.: WO2023/230889
PCT Pub. Date: Dec. 7, 2023

(65) Prior Publication Data
US 2024/0274622 A1 Aug. 15, 2024

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0231* (2025.01); *H10D 86/451* (2025.01)

(58) Field of Classification Search
CPC ................ G02F 1/1362; G02F 1/1339; G02F 1/133308; H10D 86/60; H10D 86/0231; H10D 86/01; H10D 86/451; H10D 86/40
See application file for complete search history.

(56) References Cited

U.S. PATENT DOCUMENTS

2016/0071919 A1 3/2016 Chen
2020/0212162 A1* 7/2020 Fan ..................... H10K 50/824
(Continued)

FOREIGN PATENT DOCUMENTS

CN 103745985 A 4/2014
CN 104932160 A 9/2015
(Continued)

*Primary Examiner* — Nikolay K Yushin
(74) *Attorney, Agent, or Firm* — WHDA, LLP

(57) ABSTRACT

The first source-drain metal layer included in the display module is located in a lapping area of the planarization layer, and the anode metal layer is stacked on the planarization layer. The first source-drain metal layer and the anode metal layer are electrically connected to each other through a lapping hole disposed in the lapping area. A first surface of the planarization layer includes a first area and a second area, wherein the first area is an area where the first surface of the planarization layer is parallel to a plane where the anode metal layer is located, the second area is an area where a first surface of the planarization layer intersects with the plane where the anode metal layer is located, and the first surface of the planarization layer is a surface opposite to the anode metal layer.

17 Claims, 4 Drawing Sheets

(51) Int. Cl.
*H10D 86/40* (2025.01)
*H10D 86/60* (2025.01)

(56) References Cited

U.S. PATENT DOCUMENTS

| | | | |
|---|---|---|---|
| 2021/0202812 A1* | 7/2021 | Lee | G06F 3/0412 |
| 2021/0305339 A1* | 9/2021 | Li | H10K 59/123 |
| 2022/0045155 A1* | 2/2022 | Ma | G09G 3/3233 |

FOREIGN PATENT DOCUMENTS

| | | |
|---|---|---|
| CN | 105954953 A | 9/2016 |
| CN | 107611145 A | 1/2018 |
| JP | 2003-215615 A | 7/2003 |

* cited by examiner

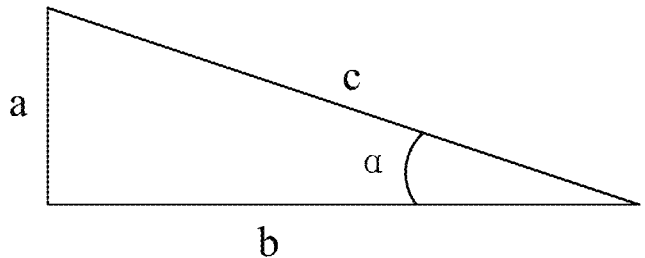

FIG. 5

--- determining the lapping position of the planarization layer, wherein the lapping position corresponds to the first surface of the planarization layer — 101 disposing a photoresist on a third area of the first surface of the planarization layer, wherein the third area is an area on the first surface of the planarization layer other than an area corresponding to the lapping position — 102 forming the lapping hole on the area corresponding to the lapping position on the first surface of the planarization layer — 103 lifting off the photoresist on the third area — 104

FIG. 6

DISPLAY MODULE, DISPLAY APPARATUS AND PLANARIZATION PROCESS

TECHNICAL FIELD

The present disclosure relates to the technical field of display apparatus and, more particularly, to a display module, a display apparatus and a planarization process.

BACKGROUND

With continuous development of display apparatuses, display modules of the display apparatuses are developing towards high resolution, low power consumption, low color deviation and color separation, and high pixel density. Color separation seriously affects display effect of the display modules, and an important factor affecting the color separation is insufficient planarization of a planarization layer of an anode metal layer substrate.

Currently, it is generally necessary to etch a lapping hole on the planarization layer to realize overlap between the anode metal layer and a source-drain metal layer included in the display module.

However, due to fluidity of a planarization-layer material and other factors, a long slope plane may be formed between a position where the lapping hole are etched on the planarization layer and a plane of the planarization layer, which further reduces an area of an area corresponding to an effective active area of a display module, leading to serious color separation of the display module and reducing display effect of the display module.

SUMMARY

A display module, a display apparatus and a planarization process are provided in an embodiment of the disclosure so as to solve a problem of serious color separation of the display module in related art.

In order to solve above technical problems, the present disclosure is realized as follows.

In a first aspect, a display module is provided in an embodiment of the present disclosure, wherein the display module includes a first source-drain metal layer, an anode metal layer, a planarization layer and an auxiliary member;

the first source-drain metal layer is located in a lapping area of the planarization layer, and the anode metal layer is stacked on the planarization layer;

the first source-drain metal layer and the anode metal layer are electrically connected to each other through a lapping hole disposed in the lapping area;

a first surface of the planarization layer includes a first area and a second area, wherein the first area is an area where the first surface of the planarization layer is parallel to a plane where the anode metal layer is located, the second area is an area where the first surface of the planarization layer intersects with the plane where the anode metal layer is located, and the first surface of the planarization layer is a surface opposite to the anode metal layer; and the auxiliary member is arranged at a first position of the lapping hole, and under action of the auxiliary member, a ratio between an area of the first area and an area of the second area is greater than a first numerical value, wherein the first numerical value is the ratio between the area of the first area and the area of the second area when the auxiliary member is not arranged at the first position of the lapping hole.

Optionally, the auxiliary member is a cushion layer;

the cushion layer is arranged at a bottom of the lapping hole, so that a height difference between the first surface of the planarization layer and a first surface of the first source-drain metal layer is smaller than a second numerical value;

wherein the first surface of the planarization layer is a surface of the planarization layer away from the cushion layer, and the first surface of the first source-drain metal layer is a surface of the first source-drain metal layer away from the cushion layer, and the second numerical value is the height difference between the first surface of the planarization layer and the first surface of the first source-drain metal layer when the cushion layer is not arranged at the bottom of the lapping hole.

Optionally, the auxiliary member is a fixing member;

wherein the fixing member is arranged at a circumferential side of the first source-drain metal layer, and a first end of the fixing member extends out of the first surface of the first source-drain metal layer, so that an included angle between a plane where the first area is located and a plane where the second area is located is greater than a first included angle value; and wherein the first surface of the first source-drain metal layer is a surface where the first source-drain metal contacts with the anode metal layer, the first end of the fixing member is an end of the fixing member facing the anode metal layer, and the first included angle value is a value of the included angle between the plane where the first area is located and the plane where the second area is located when the fixing member is not arranged at the circumferential side of the first source-drain metal layer.

Optionally, the second area is an inclined plane, and an inclination angle of the inclined plane is of a constant value; and when the cushion layer is arranged at the bottom of the lapping hole, a length of the inclined plane is smaller than a first length value, wherein the first length value is a value of a length of the inclined plane when the cushion layer is not arranged at the bottom of the lapping hole, and the length of the inclined plane is a distance between two end points of the inclined plane.

Optionally, the inclination angle of the inclined plane is greater than or equal to 15 degrees.

Optionally, the display module further includes a base film layer; and the first source-drain metal layer is stacked on the base film layer.

Optionally, when the cushion layer is arranged at the bottom of the lapping hole, a distance between the first surface of the planarization layer and the base film layer is a first distance, and a distance between the first surface of the first source-drain metal layer and the base film layer is a second distance, and a difference between the first distance and the second distance is smaller than the second numerical value.

Optionally, the cushion layer is embedded between the first source-drain metal layer and the base film layer, so that the first surface of the first source-drain metal layer is convex toward the first surface of the planarization layer.

Optionally, an area of a surface of the cushion layer close to the base film layer is larger than an area of a surface of the cushion layer away from the base film layer.

Optionally, a section of the cushion layer along a first direction is of a trapezoid shape, and a lower side edge of the trapezoid is in contact with the base film layer;

wherein the first direction is a direction perpendicular to the surface of the base film layer. Optionally, the display module further includes a grid metal layer;

the grid metal layer is stacked on the base film layer and located in the planarization layer; and the grid metal layers located in the planarization layers on both sides of the lapping area are arranged symmetrically with respect to an axis of the lapping hole.

Optionally, the display module further includes a second source-drain metal layer;

the second source-drain metal layer is stacked on the base film layer and located in the planarization layer; and the second source-drain metal layers located in the planarization layer on both sides of the lapping area are arranged symmetrically with respect to an axis of the lapping hole.

Optionally, the fixing member is a shell with two conductive ends; and the first source-drain metal layer is arranged in an inner cavity of the fixing member, and a first end of the fixing member protrudes from the first surface of the first source-drain metal layer.

In a second aspect, a display apparatus is provided in an embodiment of the present disclosure, including the display module according to any one of embodiments in the first aspect.

In a third aspect, a planarization process for a planarization layer, for forming the lapping hole according to any one of embodiments in the first aspect, including:

determining the lapping area of the planarization layer, wherein the lapping area corresponds to the first surface of the planarization layer;

disposing a photoresist on a third area of the first surface of the planarization layer, wherein the third area is an area on the first surface of the planarization layer other than an area corresponding to the lapping area; and forming the lapping hole on the area corresponding to the lapping area on the first surface of the planarization layer.

Optionally, the forming the lapping hole on the area corresponding to the lapping area on the first surface of the planarization layer includes:

forming the lapping hole on the area corresponding to the lapping area on the first surface through a dry etching process and a lift-off process.

Optionally, after forming the lapping hole on an area corresponding to the lapping area on the first surface of the planarization layer, the planarization process further includes:

lifting off the photoresist on the third area.

In the embodiment of the present disclosure, since the auxiliary member is arranged at a first position of the lapping hole, and under action of the auxiliary member, a ratio between an area of the first area and an area of the second area is greater than a first numerical value which is a ratio between the area of the first area and the area of the second area when the auxiliary member is not arranged at the first position of the lapping hole, the ratio between the area of the first area and the area of the second area is increased after the auxiliary member is arranged at the first position of the lapping hole, and thus a relative area of the first area is increased. Because the first area is an area where the first surface of the planarization layer is parallel to the plane where the anode metal layer is located, the first area is the area corresponding to the effective active area of the display module after the display module is formed, that is, after the auxiliary member is arranged at the first position of the lapping hole, the area of the area corresponding to the effective active area of the display module is increased, thereby reducing color separation of the display module and facilitating improving of the display effect of the display module.

BRIEF DESCRIPTION OF THE DRAWINGS

In order to explain embodiments of the present disclosure or the technical solution in the prior art more clearly, the drawings required in the description of the embodiments or the prior art will be briefly introduced below; obviously, the drawings in the following description are some embodiments of the present disclosure, and other drawings can be obtained according to these drawings by those of ordinary skill in the art without paying creative labor.

FIG. 5 is a schematic diagram showing changes of the height difference between the first surface of a planarization layer and the first surface of a first source-drain metal layer according to an embodiment of the present disclosure;

FIG. 6 shows a schematic flow chart of a planarization method according to an embodiment of the present disclosure;

ELEMENTS AND REFERENCE NUMBERS IN THE FIGURES

1: first source-drain metal layer; 2: planarization layer; 3: auxiliary member; 4: base film layer; 5, grid metal layer; 6: second source-drain metal layer; 7: lapping hole; 8: photoresist; 9: anode metal layer; 21: lapping area; 22: first area; 23: second area; 24: inclined plane; 31: cushion layer and 32: fixing member.

DETAILED DESCRIPTION OF THE EMBODIMENTS

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

It should be understood that references to "one embodiment" or "an embodiment" throughout the specification means that a particular feature, structure or characteristic relating to the embodiment is included in at least one embodiment of the present disclosure. Therefore, the words "in one embodiment" or "in an embodiment" appearing throughout the specification may not necessarily refer to the same embodiment. Furthermore, these specific characteristics, structures or properties may be combined in one or more embodiments in any suitable manner.

Figure 1:
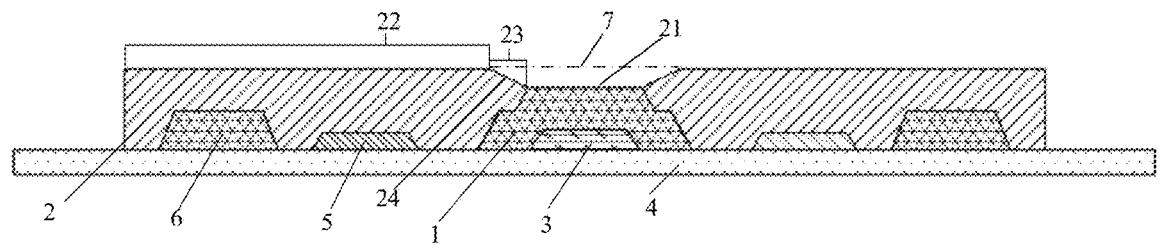
FIG. 1 shows a schematic structural diagram of a display module according to an embodiment of the present disclosure.
Figure 2:
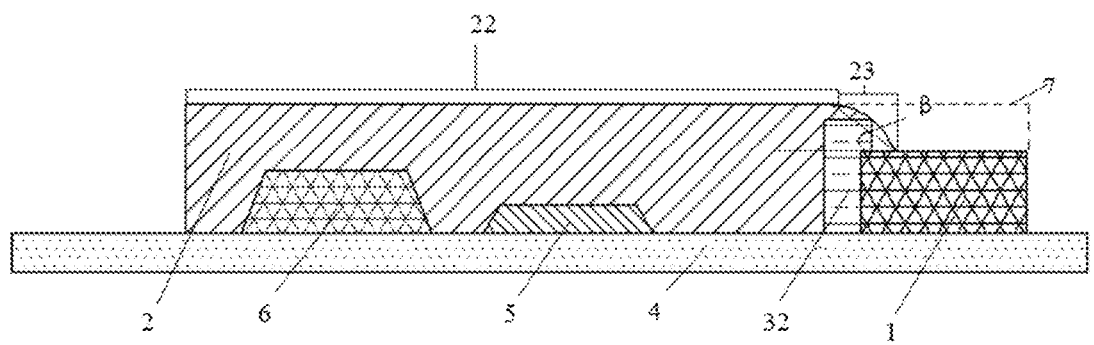
FIG. 2 shows a schematic structural diagram of another display module according to an embodiment of the present disclosure.
Figure 11:
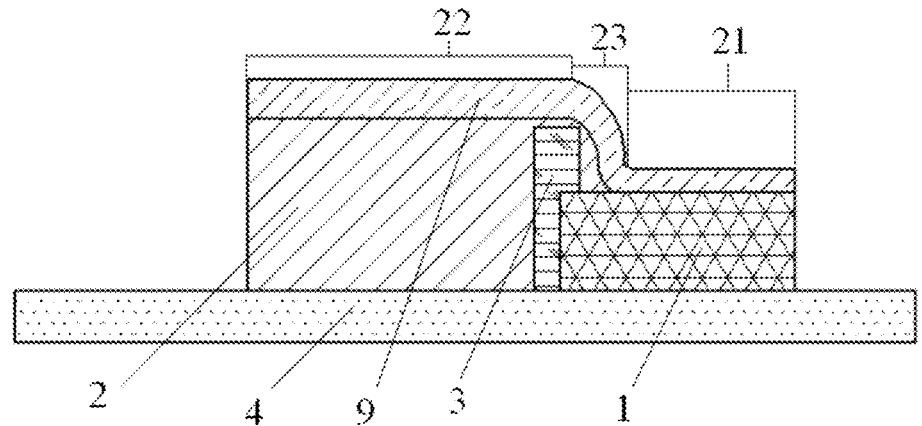
FIG. 11 shows a schematic structural diagram of yet another display module according to an embodiment of the present disclosure.

In a first aspect, a display module is provided in an embodiment of the present disclosure. FIG. 1 shows a schematic structural diagram of a display module according to an embodiment of the present disclosure, and FIG. 2 shows a schematic structural diagram of another display module according to an embodiment of the present disclosure. As shown in FIGS. 1, 2 and 11, the display module includes a first source-drain metal layer 1, an anode metal layer 9, a planarization layer 2 and an auxiliary member 3. The first source-drain metal layer 1 is located in a lapping area 21 of the planarization layer 2, and the anode metal layer 9 is stacked on the planarization layer 2. The first source-drain metal layer 1 and the anode metal layer 9 are electrically connected to each other through a lapping hole 7 disposed in the lapping area 21. A first surface of the planarization layer 2 includes a first area 22 and a second area 23, the first area 22 is an area where the first surface of the planarization layer 2 is parallel to a plane where the anode metal layer 9 is located, the second area 23 is an area where a first surface of the planarization layer 2 intersects with the plane where the anode metal layer 9 is located, and the first surface of the planarization layer 2 is a surface opposite to the anode metal layer 9. The auxiliary member 3 is arranged at a first position of the lapping hole 7, and under action of the auxiliary member 3, a ratio between an area of the first area 22 and an area of the second area 23 is greater than a first numerical value. The first numerical value is the ratio between the area of the first area 22 and the area of the second area 23 when the auxiliary member 3 is not arranged at the first position of the lapping hole 7.

The lapping hole 7 is configured for connecting the first source-drain metal layer 1 and the anode metal layer 9, and a lapping hole is usually formed on the planarization layer 2 by optical etching and the like for the connection between the first source-drain metal layer 1 and the anode metal layer 9.

In addition, as shown in FIG. 11, the first surface of the planarization layer 2 includes the first area 22 and the second area 23. The first area 22 is an area where the first surface of the planarization layer 2 is parallel to the plane where the anode metal layer 9 is located, that is, after the anode metal layer 9 is stacked on the surface of the planarization layer 2, the anode metal layer 9 is also an area where the planarization layer 2 is located and corresponding to an area arranged in a horizontal direction, that is, an area corresponding to the effective active area of the display module after the display module is formed. The second area 23 is an area where the first surface of the planarization layer 2 intersects with the plane where the anode metal layer 9 is located, that is, after the anode metal layer 9 is stacked on the surface of the planarization layer 2, the anode metal layer 9 is also an area where the planarization layer 2 is located and corresponding to an area arranged in an inclined direction, that is, an area corresponding to an ineffective active area of the display module after the display module is formed.

The auxiliary member 3 is arranged at the first position of the lapping hole 7, which can be any position on a circumferential side of the lapping hole 7, which is not limited in the embodiments of the present disclosure. Under action of the auxiliary member 3, a ratio between an area of the first area 22 and an area of the second area 23 is greater than a first numerical value, since the first numerical value is a ratio between the area of the first area 22 and the area of the second area 23 when the auxiliary member is not arranged at the first position of the lapping hole, the ratio between the area of the first area 22 and the area of the second area 23 is increased after the auxiliary member 3 is arranged at the first position of the lapping hole 7, and thus a relative area of the first area 22 is increased.

It can be seen from the above embodiment that in the embodiment of the present disclosure, since the auxiliary member 3 is arranged at a first position of the lapping hole 7, and under action of the auxiliary member 3, the ratio between the area of the first area 22 and the area of the second area 23 is greater than the first numerical value which is a ratio between the area of the first area 22 and the area of the second area 23 when the auxiliary member 3 is not arranged at the first position of the lapping hole 7, the ratio between the area of the first area 22 and the area of the second area 23 is increased after the auxiliary member 3 is arranged at the first position of the lapping hole 7, and thus a relative area of the first area 22 is increased. Because the first area 22 is an area where the first surface of the planarization layer 2 is parallel to the plane where the anode metal layer is located, the first area 22 is the area corresponding to the effective active area of the display module after the display module is formed, that is, after the auxiliary member 3 is arranged at the first position of the lapping hole 7, the area of the area corresponding to the effective active area of the display module is increased, thereby reducing color separation of the display module and facilitating improving of the display effect of the display module.

In the embodiment of the present disclosure, the ratio between the area of the first area 22 and the area of the second area 23 may be increased by reducing the height difference between the planarization layer 2 and the first source-drain metal layer 1 through the auxiliary member 3. The ratio between the area of the first area 22 and the area of the second area 23 may be increased by increasing an included angle between the plane where the first area 22 is located and the plane where the second area 23 is located through the auxiliary member 3, or the ratio between the area of the first area 22 and the area of the second area 23 may be increased by other ways, which is not limited in embodiments of the disclosure. Specifically, it can be made in several ways below.

In a possible implementation, the auxiliary member 3 is a cushion layer 31. The cushion layer 31 is arranged at a bottom of the lapping hole 7, so that the height difference between the first surface of the planarization layer 2 and the first surface of the first source-drain metal layer 1 is smaller than a second numerical value. The first surface of the planarization layer 2 is a surface of the planarization layer 2 away from the cushion layer 31, and the first surface of the first source-drain metal layer 1 is a surface of the first source-drain metal layer 1 away from the cushion layer 31, and the second numerical value is the height difference between the first surface of the planarization layer 2 and the first surface of the first source-drain metal layer 1 when the cushion layer 31 is not arranged at the bottom of the lapping hole 7.

Figure 3:
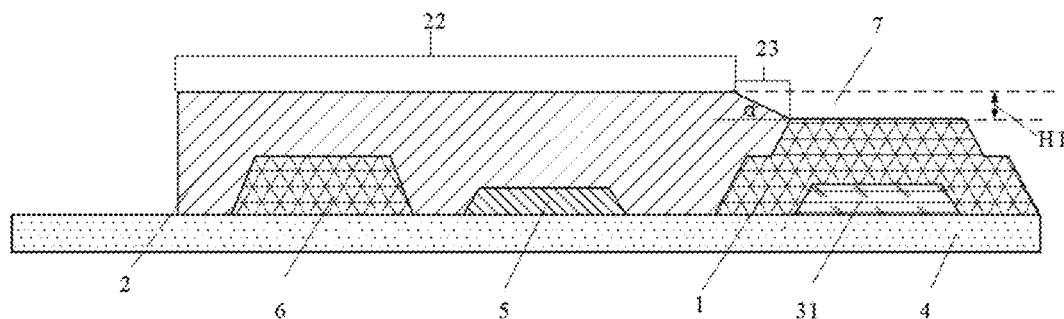
FIG. 3 is a schematic diagram showing a height difference between a first surface of a planarization layer and a first surface of a first source-drain metal layer of a display module with a cushion layer being disposed according to an embodiment of the present disclosure.
Figure 4:
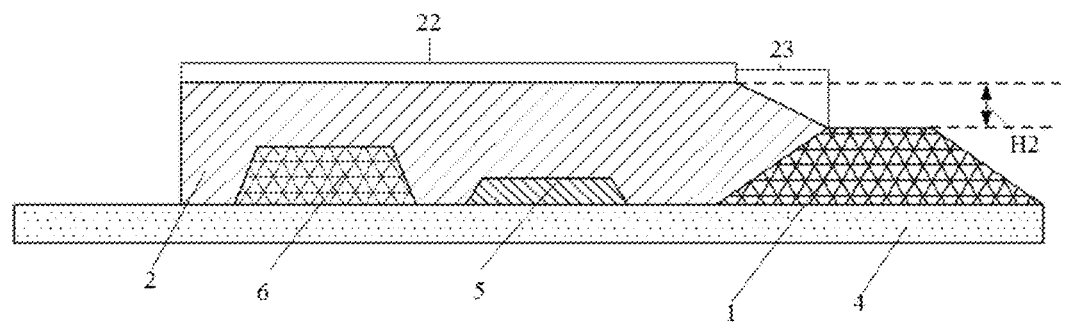
FIG. 4 is a schematic diagram showing a height difference between a first surface of a planarization layer and a first surface of a first source-drain metal layer of a display module without a cushion layer being disposed according to an embodiment of the present disclosure.

It should be noted that, as shown in FIGS. 3 and 4, since the first source-drain metal layer 1 and the anode metal layer are electrically connected to each other through the lapping hole 7 arranged in the lapping area 21, the first source-drain metal layer 1 is located in the lapping area 21 of the planarization layer 2, when the cushion layer 31 is arranged at the bottom of the lapping hole 7, the first source-drain metal layer 1 extends in a direction close to the anode metal layer, so that the height difference between the first surface of the planarization layer 2 and the first surface of the first source-drain metal layer 1 is smaller than the second numerical value. Because the second numerical value is the height difference between the first surface of the planarization layer 2 and the first surface of the first source-drain metal layer 1 when the cushion layer 31 is not arranged at the bottom of the lapping hole 7, a length of the second area 23 is reduced when an inclination angle of the second area 23 and a length of the first surface of the first source-drain metal layer 1 are unchanged, so that the ratio between the area of the first area 22 and the area of the second area 23 is increased, and thus the relative area of the first area 22 is increased. The height difference between the first surface of the planarization layer 2 and the first surface of the first source-drain metal layer 1 is shown as H1 in FIG. 3 when the cushion layer 31 is arranged at the bottom of the lapping hole 7, and the height difference between the first surface of the planarization layer 2 and the first surface of the first source-drain metal layer 1 is shown as H2 in FIG. 4 when the cushion layer 31 is not arranged at the bottom of the lapping hole 7.

Further, the second area 23 is an inclined plane 24, and the inclination angle of the inclined plane 24 is a constant value. When the cushion layer 31 is arranged at the bottom of the lapping hole 7, a length of the inclined plane 24 is smaller than a first length value. The first length value is a value of a length of the inclined plane 24 when the cushion layer 31 is not arranged at the bottom of the lapping hole 7, and the length of the inclined plane 24 is a distance between two end points of the inclined plane 24.

It should be noted that for convenience of understanding, a length corresponding to the height difference between the first surface of the planarization layer 2 and the first surface of the first source-drain metal layer 1, the length of the first surface of the first source-drain metal layer 1 and the length of the inclined plane 24 may be constructed to be a right triangle, where the length corresponding to the height difference between the first surface of the planarization layer 2 and the first surface of the first source-drain metal layer 1 and the length of the first surface of the first source-drain metal layer 1 are perpendicular to each other. As shown in FIG. 5, the inclination angle of the inclined plane 24 is shown as a in FIG. 5, the length of the inclined plane 24 is shown as c in FIG. 5, the length corresponding to the height difference between the first surface of the planarization layer 2 and the first surface of the first source-drain metal layer 1 is shown as a in FIG. 5, and the length of the first surface of the first source-drain metal layer 1 is shown as b in FIG. 5. In this way, when a and b are unchanged, if the length of a decreases, the length of c also decreases, that is, the length of the inclined plane 24 decreases with the length corresponding to the height difference between the first surface of the planarization layer 2 and the first surface of the first source-drain metal layer 1. In this way, when a length of the second area 23 is reduced, the ratio between the area of the first area 22 and the area of the second area 23 may be increased.

It should also be noted that the length of the inclined plane 24 is a distance between an intersection line between the second area 23 and the first area 22 and an intersection line between the second area 23 and the first surface of the first metal source-drain layer, that is, a distance between the two end points of the inclined plane 24.

Optionally, the inclination angle of the inclined plane 24 is greater than or equal to 15 degrees. It should be noted that when the inclination angle of the inclined plane 24 is greater than or equal to 15 degrees, the inclination degree of the inclined plane 24 may be controlled within a certain range, and the area of the second area 23 may be maintained within a certain range as inclination of the inclined plane 24 is greater than a certain value.

In some embodiments, the display module further includes a base film layer 4. The first source-drain metal layer 1 is stacked on the base film layer 4. It should be noted that the base film layer 4 is other film layers arranged at a bottom of the planarization layer 2 in the display module. The base film layer 4 is configured to provide a stacking space for the first source-drain metal layer 1 and to transmit information transmitted by the first source-drain metal layer 1.

Further, when the cushion layer 31 is arranged at the bottom of the lapping hole 7, a distance between the first surface of the planarization layer 2 and the base film layer 4 is a first distance, and a distance between the first surface of the first source-drain metal layer 1 and the base film layer 4 is a second distance, and the difference between the first distance and the second distance is smaller than the second numerical value. In this way, it can be ensured that when the cushion layer 31 is arranged at the bottom of the lapping hole 7, the first source-drain metal layer 1 extends in a direction close to the anode metal layer, so that the height difference between the first surface of the planarization layer 2 and the first surface of the first source-drain metal layer 1 is smaller than the second numerical value.

In some embodiments, the cushion layer 31 is embedded between the first source-drain metal layer 1 and the base film layer 4, and the first surface of the first source-drain metal layer 1 is convex toward the first surface of the planarization layer 2. It should be noted that since the layers are embedded between the first source-drain metal layer 1 and the base film layer 4, and the first surface of the first source-drain metal layer 1 is convex toward the first surface of the planarization layer 2, the first source-drain metal layer 1 extends in the direction close to the anode metal layer, so that the height difference between the first surface of the planarization layer 2 and the first surface of the first source-drain metal layer 1 is reduced, and thus the ratio between the area of the first area 22 and the area of the second area 23 is increased.

Optionally, an area of the surface of the cushion layer 31 close to the base film layer 4 is larger than an area of the surface of the cushion layer 31 away from the base film layer 4. In this way, if the area of the surface of the cushion layer 31 close to the base film layer 4 is larger than the area of the surface of the cushion layer 31 away from the base film layer 4, a contact area between the cushion layer 31 and the base film layer 4 may be made larger than a contact area between the cushion layer 31 and the first source-drain metal layer 1. As both the cushion layer 31 and the first source-drain metal layer 1 are stacked on the base film layer 4, which may reduce the difficulty in disposing the cushion layer 31, and facilitate improving the stability in disposing the cushion layer 31.

Optionally, a section of the cushion layer 31 along the first direction is of a trapezoid shape, and a lower side edge of the trapezoid is in contact with the base film layer 4. The first direction is a direction perpendicular to the surface of the base film layer 4. In this way, when a section of the cushion layer 31 along the first direction is of the trapezoid shape, it can be ensured that the contact area between the cushion layer 31 and the base film layer 4 may be larger than the contact area between the cushion layer 31 and the first source-drain metal layer 1, thus reducing the difficulty in disposing the cushion layer 31.

In some embodiments, the display module further includes a grid metal layer 5. The grid metal layer 5 is stacked on the base film layer 4 and located in the planarization layer 2. The grid metal layers 5 located in the planarization layer 2 on both sides of the lapping area 21 are arranged symmetrically with respect to an axis of the lapping hole 7. In this way, the grid metal layers 5 in the planarization layer 2 located on both sides of the lapping area 21 are evenly distributed on both sides of the lapping hole 7, thereby facilitating deposition of the grid metal layers 5 on the base film layer 4.

In some embodiments, the display module further includes a second source-drain metal layer 6. The second source-drain metal layer 6 is stacked on the base film layer 4 and located in the planarization layer 2. The second source-drain metal layers 6 located in the planarization layer 2 on both sides of the lapping area 21 are arranged symmetrically with respect to an axis of the lapping hole 7. In this way, the second source-drain metal layers 6 in the planarization layer 2 located on both sides of the lapping area 21 are evenly distributed on both sides of the lapping hole 7, thereby facilitating deposition of the second source-drain metal layers 6 on the base film layer 4.

In another implementation, as shown in FIG. 2, the auxiliary member 3 is a fixing member 32. The fixing member 32 is arranged at a circumferential side of the first source-drain metal layer 1, and a first end of the fixing member 32 extends out of the first surface of the first source-drain metal layer 1, so that the included angle between the plane where the first area 22 is located and the plane where the second area 23 is located is greater than a first included angle value. The first surface of the first source-drain metal layer 1 is a surface of the first source-drain metal contacting the anode metal layer, the first end of the fixing member 32 is an end of the fixing member 32 facing the anode metal layer, and the first included angle value is a value of an included angle between the plane where the first area 22 is located and the plane where the second area 23 is located when the fixing member 32 is not arranged at a circumferential side of the first source-drain metal layer 1.

It should be noted that the fixing member 32 may be a metal piece or a non-metal piece, which is not limited in embodiments of the present disclosure. The fixing member 32 is arranged at the circumferential side of the first source-drain metal layer 1, that is, the fixing member 32 is arranged around the first source-drain metal layer 1, and the first end of the fixing member 32 extends out of the first surface of the first source-drain metal layer 1, that is, the first end of the fixing member 32 extends in a direction close to the first area 22 of the planarization layer 2. In this way, the first end of the fixing member 32 extends out of the first surface of the first source-drain metal layer 1, so that the included angle between the plane where the first area 22 is located and the plane where the second area 23 is located is greater than the first included angle value, so that the second area 23 forms a large slope angle, which facilitates preventing a material of the planarization layer 2 from overflowing and collapsing, thereby increasing the ratio between the area of the first area 22 and the area of the second area 23, and further increasing the relative area of the first area 22. Because the first area 22 is an area where the first surface of the planarization layer 2 is parallel to the plane where the anode metal layer is located, the first area 22 is the area corresponding to the effective active area of the display module after the display module is formed, that is, after the fixing member 32 is arranged at the circumferential side of the first source-drain metal layer 1, the area of the area corresponding to the effective active area of the display module is increased, thereby reducing color separation of the display module and facilitating improving the display effect of the display module. An included angle between the plane where the first area 22 is located and the plane where the second area 23 is located is shown as β in FIG. 2.

Optionally, the fixing member 32 is a shell with two conductive ends. The first source-drain metal layer 1 is arranged in an inner cavity of the fixing member 32, and a first end of the fixing member 32 protrudes from the first surface of the first source-drain metal layer 1. It should be noted that since the fixing member 32 is a shell with two conductive ends and the first source-drain metal layer 1 is arranged in the inner cavity of the fixing member 32, it can be ensured that the fixing member 32 is arranged at the circumferential side of the first source-drain metal layer 1, and it is convenient for the first end of the fixing member 32 to extend out of the first surface of the first source-drain metal layer 1.

It can be seen from the above embodiment that in the embodiment of the present disclosure, since the auxiliary member 3 is arranged at a first position of the lapping hole 7, and under action of the auxiliary member 3, the ratio between the area of the first area 22 and the area of the second area 23 is greater than the first numerical value which is a ratio between the area of the first area 22 and the area of the second area 23 when the auxiliary member 3 is not arranged at the first position of the lapping hole 7. The ratio between the area of the first area 22 and the area of the second area 23 is increased after the auxiliary member 3 is arranged at the first position of the lapping hole 7, and thus a relative area of the first area 22 is increased. Because the first area 22 is an area where the first surface of the planarization layer 2 is parallel to the plane where the anode metal layer is located, the first area 22 is the area corresponding to the effective active area of the display module after the display module is formed, that is, after the auxiliary member 3 is arranged at the first position of the lapping hole 7, the area of the area corresponding to the effective active area of the display module is increased, thereby reducing color separation of the display module and facilitating improving of the display effect of the display module.

In a second aspect, a display apparatus is further disposed in an embodiment of the present disclosure, which includes the display module described in any one of the embodiments of the first aspect.

It should be noted that the display apparatus may be a mobile display apparatus such as a mobile phone, a tablet computer, a notebook computer, a palm computer, a vehicle-mounted display apparatus, a wearable device, an ultra-mobile personal computer (UMPC), a netbook or a personal digital assistant (PDA). The non-mobile display apparatus may be a personal computer (PC), a television (TV), an automatic teller machine or a self-service machine, etc., which is not specifically limited in the embodiments of the present disclosure. The display apparatus has same beneficial effects as the display module described above, which will not be repeatedly described in detail in the embodiment of the disclosure.

In a third aspect, a planarization process for the planarization layer 2 is further disposed in an embodiment of the present disclosure, which is configured to form the lapping hole 7 according to any one of the embodiments of the first aspect. As shown in FIG. 6, the process includes following steps 101 to 104.

In the step 101, the lapping area 21 of the planarization layer 2 is determined, and the lapping area 21 corresponds to the first surface of the planarization layer 2.

Figure 7:
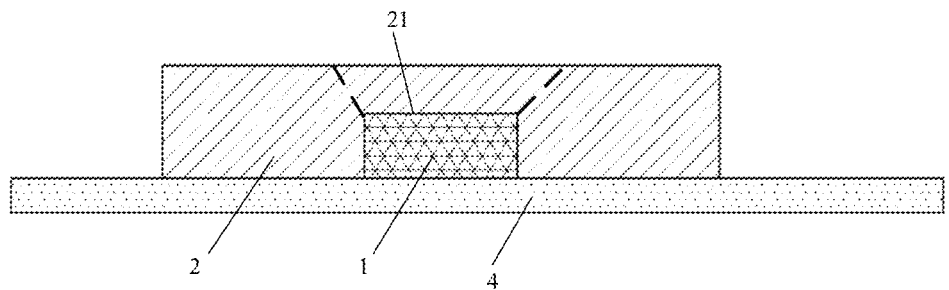
FIG. 7 shows a schematic structural diagram of a display module with one of forming processes of a lapping hole according to an embodiment of the present disclosure.

The lapping area 21 of the planarization layer 2 is a position to provide a lapping space for the lapping area 21 of the planarization layer 2. A structure of the display module in step 101 is shown in FIG. 7.

In the step 102, the photoresist 8 is disposed on a third area of the first surface of the planarization layer 2, the third area is an area on the first surface of the planarization layer 2 other than an area corresponding to the lapping area 21.

Figure 8:
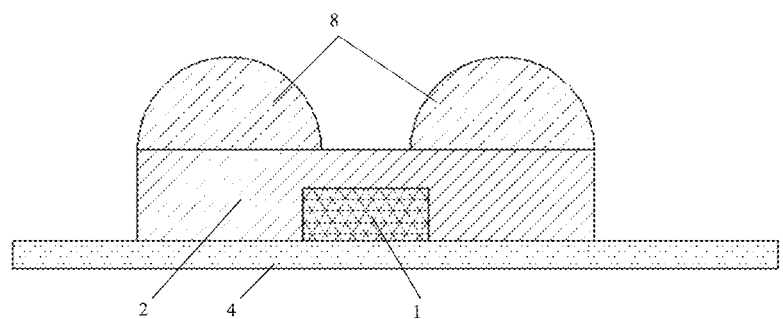
FIG. 8 shows a schematic structural diagram of a display module with another of the forming processes of the lapping hole according to an embodiment of the present disclosure.

It should be noted that the third area is an area on the planarization layer other than a reserved space for defining of the lapping hole 7. In this way, because the photoresist 8 is arranged in the third area of the first surface of the planarization layer 2, in a subsequent process of forming the lapping hole 7 in the lapping area 21, the third area can be protected from corrosion during the forming process by the photoresist 8, and structural integrity of the third area may be ensured. In the embodiment of the present disclosure, the third area is the same as an area where the first area 22 is located in the display module described above. A structure of the display module in step 102 is shown in FIG. 8.

In the step 103, the lapping hole 7 is formed in an area corresponding to the lapping area 21 on the first surface of the planarization layer 2.

Figure 9:
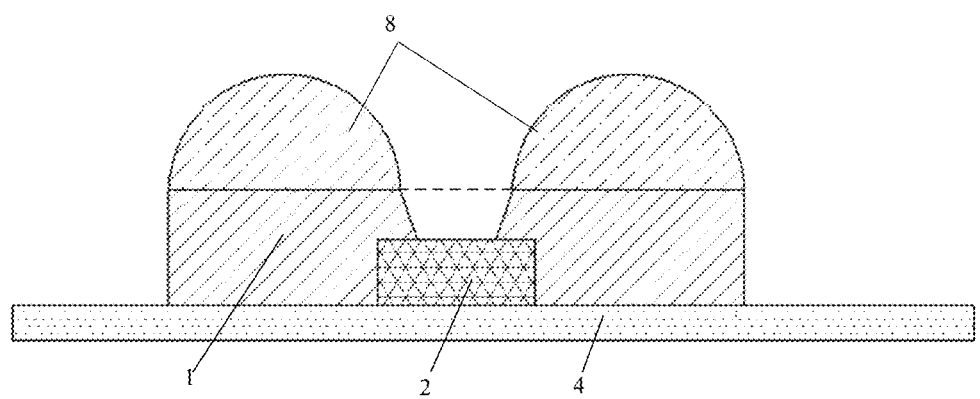
FIG. 9 shows a schematic structural diagram of a display module with yet another of the forming processes of the lapping hole according to an embodiment of the present disclosure.

It should be noted that since the photoresist 8 is arranged on the third area of the first surface of the planarization layer 2, only an area where the lapping area 21 is located is etched in the lapping hole 7, which is beneficial to avoid a structure of the third area from being damaged. A structure of the display module in step 103 is shown in FIG. 9.

Optionally, the step 103 includes forming the lapping hole 7 on the area corresponding to the lapping area 21 on the first surface through a dry etching process and a lift-off process.

It should be noted that due to good directionality of the dry etching process, formation of a large slope angle of the second area 23 may be realized, which increases the ratio between the area of the first area 22 and the area of the second area 23, and further increases the relative area of the first area 22.

Optionally, after the step 103, the process further includes step 104 in which the photoresist 8 on the third area is lift off.

Figure 10:
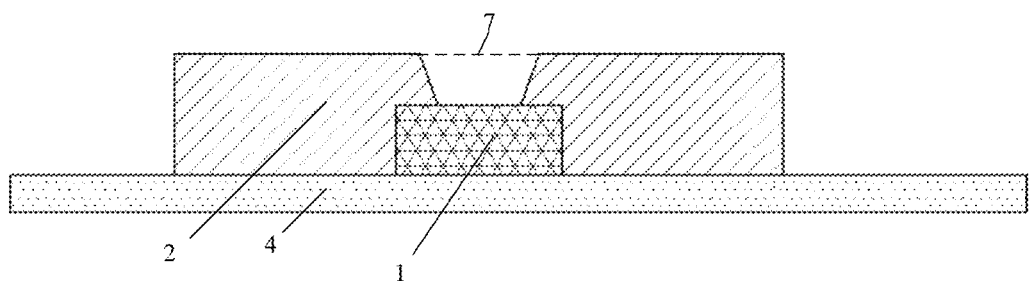
FIG. 10 shows a schematic structural diagram of a display module with still another of the forming processes of the lapping hole according to an embodiment of the present disclosure.

In this way, by lifting off the photoresist 8 on the third area, it is convenient to subsequently deposit other layers of the display module on the planarization layer 2. A structure of the display module in step 104 is shown in FIG. 10.

It can be seen from the above embodiments that in the embodiment of the present disclosure, by determining the lapping area 21 of the planarization layer 2, the photoresist 8 is disposed on the third area of the first surface of the planarization layer 2, and forming the lapping hole 7 in the area corresponding to the lapping area 21 on the first surface of the planarization layer 2, so that in the process of forming the lapping hole 7, the third area may be protected from corrosion during the forming process by the photoresist 8, and structural integrity of the third area may be ensured, which is beneficial to increase the ratio between the area of the first area 22 and the area of the second area 23, so as to increase the area of the area corresponding to the effective active area of the display module, thereby reducing color separation of the display module and facilitating improving the display effect of the display module. Moreover, by forming the lapping hole 7 on the area corresponding to the lapping area 21 on the first surface through the dry etching process and the lift-off process, the formation of the large slope angle of the second area 23 can be realized, which increases the ratio between the area of the first area 22 and the area of the second area 23, and further increases the relative area of the first area 22.

It should be noted that various embodiments in the description are described in a progressive manner, each of the embodiments focuses on the differences with other embodiments. The same or similar parts of the various embodiments can be referred to each other.

Although alternative embodiments of the embodiments of the present disclosure have been described, additional changes and modifications may be made to these embodiments once the basic creative concepts are known to a person skilled in the art. Accordingly, the attached claims are intended to be construed to include optional embodiments and all changes and modifications falling within the scope of the embodiments of the present disclosure.

Finally, it should also be noted that in this article, relational terms such as first and second are used only to distinguish one entity from another without necessarily requiring or implying any such actual relationship or order between these entities or operations. Moreover, the term 'including', 'containing' or any other variant is intended to cover non-exclusive inclusion, so that the objects or terminal devices that include a series of elements includes not only those elements, but also other elements that are not clearly listed, or also includes the inherent elements of such the objects or terminal devices. Without more restrictions, the limited elements by the sentence 'includes one . . . ' do not exclude that there are other same elements in the objects or terminal devices equipment that include the elements.

Technical solutions according to the present disclosure has been introduced in detail above, and principle and embodiments of the present disclosure have been set forth with specific examples in this document. Meanwhile, changes can be made to the specific embodiments and application scope by ordinary skilled in the art according to the principle and embodiments of the present disclosure. To sum up, contents of this specification should not be construed as limitation to the present disclosure.

The invention claimed is:

1. A display module, wherein the display module comprises a first source-drain metal layer, an anode metal layer, a planarization layer and an auxiliary member;
the first source-drain metal layer is located in a lapping area of the planarization layer, and the anode metal layer is stacked on the planarization layer;
the first source-drain metal layer and the anode metal layer are electrically connected to each other through a lapping hole disposed in the lapping area;
a first surface of the planarization layer comprises a first area and a second area, wherein the first area is an area where the first surface of the planarization layer is parallel to a plane where the anode metal layer is located, the second area is an area where the first surface of the planarization layer intersects with the plane where the anode metal layer is located, and the first surface of the planarization layer is a surface opposite to the anode metal layer; and
the auxiliary member is arranged at a first position of the lapping hole, and under action of the auxiliary member, a ratio between an area of the first area and an area of the second area is greater than a first numerical value, wherein the first numerical value is the ratio between the area of the first area and the area of the second area when the auxiliary member is not arranged at the first position of the lapping hole, and the area of the second area is greater than 0.

2. The display module according to claim 1, wherein the auxiliary member is a fixing member;
wherein the fixing member is arranged at a circumferential side of the first source-drain metal layer, and a first end of the fixing member extends out of the first surface of the first source-drain metal layer, so that an included angle between a plane where the first area is located and a plane where the second area is located is greater than a first included angle value; and
wherein the first surface of the first source-drain metal layer is a surface where the first source-drain metal contacts with the anode metal layer, the first end of the fixing member is an end of the fixing member facing the anode metal layer, and the first included angle value is a value of the included angle between the plane where the first area is located and the plane where the second area is located when the fixing member is not arranged at the circumferential side of the first source-drain metal layer.

3. The display module according to claim 2, wherein the fixing member is a shell with two conductive ends; and
the first source-drain metal layer is arranged in an inner cavity of the fixing member, and a first end of the fixing member protrudes from the first surface of the first source-drain metal layer.

4. A display apparatus, comprising the display module according to claim 1.

5. The display apparatus according to claim 4, wherein the auxiliary member is a fixing member;
wherein the fixing member is arranged at a circumferential side of the first source-drain metal layer, and a first end of the fixing member extends out of the first surface of the first source-drain metal layer, so that an included angle between a plane where the first area is located and a plane where the second area is located is greater than a first included angle value; and
wherein the first surface of the first source-drain metal layer is a surface where the first source-drain metal contacts with the anode metal layer, the first end of the fixing member is an end of the fixing member facing the anode metal layer, and the first included angle value is a value of the included angle between the plane where the first area is located and the plane where the second area is located when the fixing member is not arranged at the circumferential side of the first source-drain metal layer.

6. The display apparatus according to claim 4, wherein the auxiliary member is a cushion layer;
the cushion layer is arranged at a bottom of the lapping hole, so that a height difference between the first surface of the planarization layer and a first surface of the first source-drain metal layer is smaller than a second numerical value;
wherein the first surface of the planarization layer is a surface of the planarization layer away from the cushion layer, and the first surface of the first source-drain metal layer is a surface of the first source-drain metal layer away from the cushion layer, and the second numerical value is the height difference between the first surface of the planarization layer and the first surface of the first source-drain metal layer when the cushion layer is not arranged at the bottom of the lapping hole.

7. The display apparatus according to claim 6, wherein the second area is an inclined plane, and an inclination angle of the inclined plane is of a constant value; and
when the cushion layer is arranged at the bottom of the lapping hole, a length of the inclined plane is smaller than a first length value, wherein the first length value is a value of a length of the inclined plane when the cushion layer is not arranged at the bottom of the lapping hole, and the length of the inclined plane is a distance between two end points of the inclined plane.

8. The display module according to claim 1, wherein the auxiliary member is a cushion layer;
the cushion layer is arranged at a bottom of the lapping hole, so that a height difference between the first surface of the planarization layer and a first surface of the first source-drain metal layer is smaller than a second numerical value;
wherein the first surface of the planarization layer is a surface of the planarization layer away from the cushion layer, and the first surface of the first source-drain metal layer is a surface of the first source-drain metal layer away from the cushion layer, and the second numerical value is the height difference between the first surface of the planarization layer and the first surface of the first source-drain metal layer when the cushion layer is not arranged at the bottom of the lapping hole.

9. The display module according to claim 8, wherein the second area is an inclined plane, and an inclination angle of the inclined plane is of a constant value; and
when the cushion layer is arranged at the bottom of the lapping hole, a length of the inclined plane is smaller than a first length value, wherein the first length value is a value of a length of the inclined plane when the cushion layer is not arranged at the bottom of the lapping hole, and the length of the inclined plane is a distance between two end points of the inclined plane.

10. The display module according to claim 9, wherein the inclination angle of the inclined plane is greater than or equal to 15 degrees.

11. The display module according to claim 8, wherein the display module further comprises a base film layer; and the first source-drain metal layer is stacked on the base film layer.

12. The display module according to claim 11, wherein when the cushion layer is arranged at the bottom of the lapping hole, a distance between the first surface of the planarization layer and the base film layer is a first distance, and a distance between the first surface of the first source-drain metal layer and the base film layer is a second distance, and a difference between the first distance and the second distance is smaller than the second numerical value.

13. The display module according to claim 11, wherein the display module further comprises a grid metal layer;
the grid metal layer is stacked on the base film layer and located in the planarization layer; and
the grid metal layers located in the planarization layers on both sides of the lapping area are arranged symmetrically with respect to an axis of the lapping hole.

14. The display module according to claim 11, wherein the display module further comprises a second source-drain metal layer;
the second source-drain metal layer is stacked on the base film layer and located in the planarization layer; and
the second source-drain metal layers located in the planarization layer on both sides of the lapping area are arranged symmetrically with respect to an axis of the lapping hole.

15. The display module according to claim 11, wherein the cushion layer is embedded between the first source-drain metal layer and the base film layer, so that the first surface of the first source-drain metal layer is convex toward the first surface of the planarization layer.

16. The display module according to claim 15, wherein an area of a surface of the cushion layer close to the base film layer is larger than an area of a surface of the cushion layer away from the base film layer.

17. The display module according to claim 16, wherein a section of the cushion layer along a first direction is of a trapezoid shape, and a lower side edge of the trapezoid is in contact with the base film layer;
wherein the first direction is a direction perpendicular to the surface of the base film layer.

* * * * *